United States Patent [19]

Guggenheim

[11] 4,171,344
[45] Oct. 16, 1979

[54] CRYSTAL GROWTH FROM SOLUTION
[75] Inventor: Howard J. Guggenheim, Somerville, N.J.
[73] Assignee: Bell Telephone Laboratories, Incorporated, Murray Hill, N.J.
[21] Appl. No.: 483,303
[22] Filed: Jun. 26, 1974
[51] Int. Cl.² .............................................. C01C 3/00
[52] U.S. Cl. .................................... 423/364; 423/463; 423/659; 23/295 G; 23/305 R; 156/DIG. 101
[58] Field of Search ............... 423/368, 463, 364, 365, 423/659; 23/295, 305; 156/DIG. 101

[56] References Cited
U.S. PATENT DOCUMENTS

| 2,383,946 | 9/1945 | Tietig ........................... 423/659 |
| 3,371,036 | 2/1968 | Torgesen et al. ............... 23/295 G |
| 3,788,818 | 1/1974 | Madjid et al. .................... 23/305 |

Primary Examiner—Earl C. Thomas
Attorney, Agent, or Firm—Allen N. Friedman

[57] ABSTRACT

Crystals are grown from solution by the introduction of a first fluid into a second fluid by permeation through a porous partition. Introduction of the first fluid produces supersaturation of the desired material in the combined fluid in the vicinity of the partition. Supersaturation results in the production of crystals. The crystals grow from the partition into the solution. The supersaturation is produced by one of several mechanisms including: chemical reaction producing a less soluble element or compound; decomplexation produced by dilution or pH change; and introduction of solution into a solvent in which the material is less soluble.

1 Claim, 1 Drawing Figure

U.S. Patent
Oct. 16, 1979
4,171,344
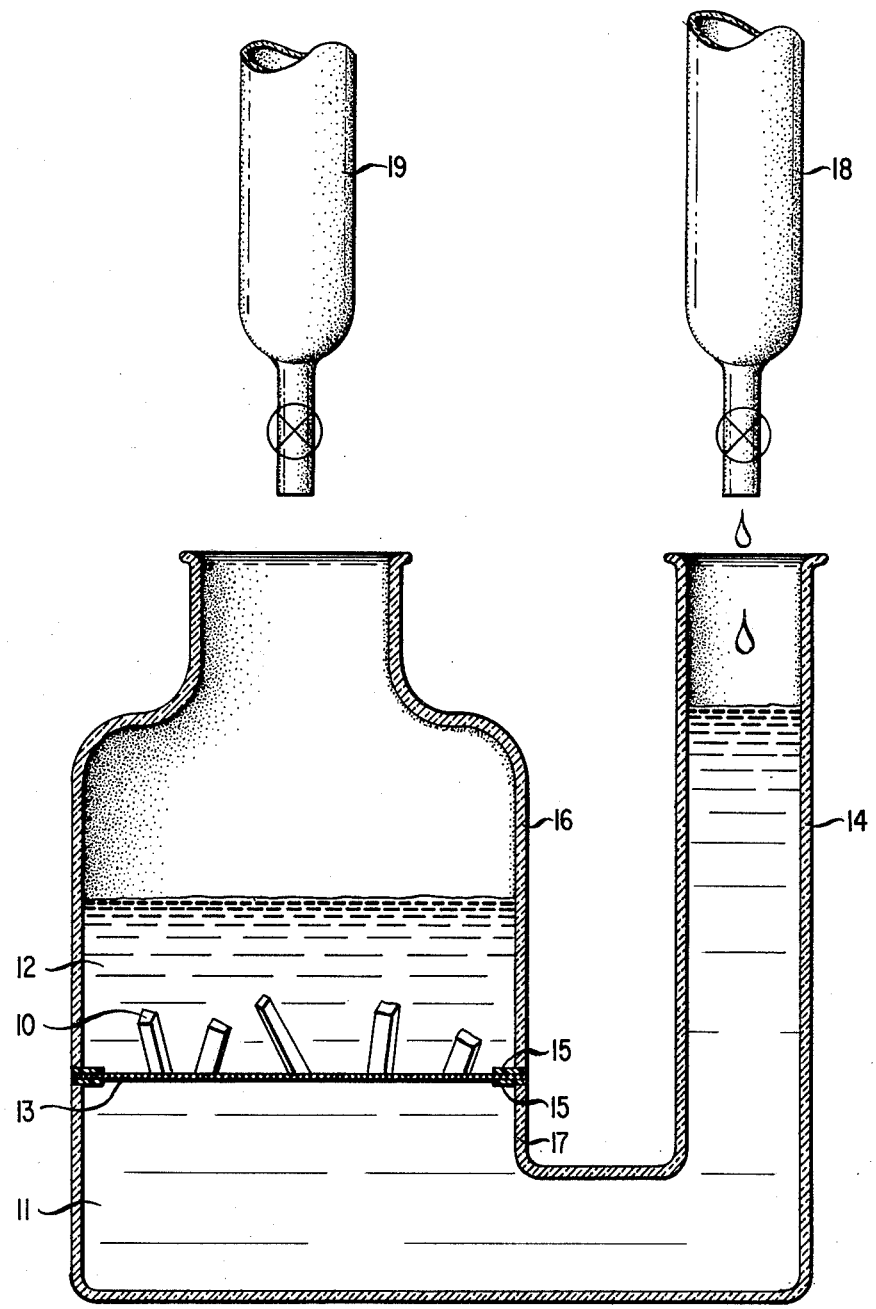

CRYSTAL GROWTH FROM SOLUTION

BACKGROUND OF THE INVENTION

1. Field of the Invention

The invention is in the field of crystal growth.

2. Brief Description of the Prior Art

Many crystalline materials of commercial and scientific interest can be produced by the mixture of two solutions if a suitable technique can be found to avoid the problems inherent in such a process. Such processes depend upon the mixture of solutions producing a supersaturation of the desired product in the mixed solution. One important phenomenon to be avoided is the spontaneous nucleation of tiny crystals throughout the solution and immediate precipitation.

In order to accomplish the growth of usefully large crystals several techniques have been developed, generally involving slow introduction of one solution into the other or of both into a third substance. One of these techniques involves the growth of crystals in a gel (*Crystal Growth in Gels*, H. K. Henisch, Pennsylvania State University Press, 1970). These methods variously involve incorporation of one solution in a gel and diffusion of material from a contacting liquid into the gel, producing supersaturation and crystal growth within the gel, or diffusion of two solutions contacting opposite sides of a gel containing a third liquid. Other methods involve the slow introduction of two solutions into a third liquid by, for example, slowly dripping the solutions into a body of the third liquid or diffusion of material from the two solutions through semipermeable membranes into the third liquid (*The Growth of Single Crystals*, R. A. Laudise, Prentice-Hall, 1970, page 271) or by introduction of the two solutions through two gel plugs into the third body of liquid (*Journal of Crystal Growth*, Vol. 12 1972, page 179).

In the above-mentioned methods the nature of the gels and semipermeable membranes used, places restrictions on the chemical systems to which these methods can be applied. That is to say: The material of the gel is sometimes incorporated in the crystal as a contaminant; the structure of the gel is in many cases sensitive to solution parameters, such as pH; the rate of diffusion of materials through gels is difficult to vary over wide ranges; and semipermeable membranes of the desired selectivity are not always available.

SUMMARY OF THE INVENTION

A versatile, easily controlled method has been found, to permit the growth of crystals from solution by the regulated introduction of one liquid into another. In this method, the two liquids are separated by a porous partition. A pressure difference is maintained across the partition to force one liquid into the other at a slow rate which can be controlled over wide ranges by the choice of pore size and the magnitude of the pressure difference. A wide choice of partition materials is available so as to greatly reduce the problem of contamination and sensitivity to solution conditions. Doping levels of minor constituents in the crystal are easier to control, since the dopant is carried through the partition with the solution. Thus, the dopant content of the crystal is not dependent upon the diffusion rate of the dopant through a gel or semipermeable membrane, relative to the diffusion rate of the other constituents of the introduced solutions. Application of this technique has permitted the growth of usefully large single crystals of $K_2[Pt(CN)_4]Br_{0.3}.3H_2O$, a material useful for its highly anisotropic electrical and optical properties.

BRIEF DESCRIPTION OF THE DRAWING

The FIGURE is an elevational view in section of an exemplary crystal growth apparatus.

DETAILED DESCRIPTION OF THE INVENTION

Applicable Chemical Systems

The described method of crystal growth by introduction of one liquid into another through a porous partition depends on the production of a supersaturation condition of the desired material in the mixed liquid. Several different chemical phenomena can produce this supersaturation condition.

(1) Chemical reaction to form a less soluble compound.

Chemical reactions which result in the formation of a less soluble product include the reaction of two soluble ionic compounds to form a less soluble compound and the reaction of an oxidized compound and an unoxidized compound to form a less soluble partially ozidized compound. An example of the former is the reaction of an aqueous solution of calcium chloride with tartaric acid to form calcium tartrate. An example of the latter is the combination of an aqueous solution of $K_2[Pt(CN)_4]Br_2$ with an aqueous solution of $K_2[Pt(CN)_4]$ to produce crystals of $K_2[Pt(CN)_4].Br_{0.3}.3H_2O$. Another reaction of this class is exemplified by the reduction of gold chloride with oxalic acid to produce gold crystals.

(2) Decomplexing.

Many compounds are more soluble when complexed with other compounds in solution. The extent of this additional solubility is, typically, dependent upon solution conditions such as concentration of the complex or the pH of the solution. For example, cuprous chloride is much more soluble in water when complexed with hydrochloric acid. The extra solubility of the cuprous chloride is dependent upon the concentration of the solution. If such a solution is introduced into water, the mixed solution is supersaturated and cuprous chloride crystals are produced. Cuprous chloride crystals are useful for their electrooptic properties.

(3) Change of Solvent.

Many materials are more soluble in one solvent than they are in another solvent, with which the first solvent is missible. Introduction of, for example, a saturated solution of such material dissolved in the higher solubility solvent, into a body of the second solvent produces supersaturation of the material. For example, triglycene sulphate is much more soluble in water than in alcohol. Introduction of a saturated aqueous solution of triglycene sulphate into alcohol results in supersaturation of the triglycene sulphate. Triglycene sulphate crystals are useful for their ferroelectric properties.

Growth Apparatus

The FIGURE shows an exemplary growth apparatus in which crystals 10 are produced by the introduction of one liquid 11 into a body of a second liquid 12 by permeation of the first liquid 11 through a porous partition 13. One particular material which has been successfully used in the growth of a wide range of crystal materials, and is a filter membrane consisting of fibers of tetrafluoroethylene. This filter material is available in a wide range of porosities. Possible partition materials include porous ceramics and other filter membranes.

The first liquid 11 is forced through the porous partition 13 by maintaining a difference in the hydrostatic pressure on either side of the partition 13. In the illustrated exemplary apparatus, this pressure difference is produced by maintaining the first liquid 11 at a level higher than the level of the second liquid 12 in a side arm 14. Other possible methods of maintaining this pressure difference include maintaining the first liquid 11 under a regulated gas pressure or use of a weighted piston. Pressures or liquid levels can be arranged so that liquid is forced downward in order to produce crystal growth on the lower surface of the partition 13. Indeed, crystals have been grown in apparatus in which the partition 13 is vertical and the direction of liquid flow is horizontal.

As the first liquid 11 is forced through the porous membrane 13, supersaturation of the desired material is produced and deposition of crystalline material results at sites of spontaneous nucleation on the partition or on single crystal seeds which have been placed on the partition. Since crystal growth takes place in contact with the membrane, rather than on seeds suspended in the bulk of the upper solution, it is not necessary to supersaturate the entire bulk of the solution. This requires less of the lower solution and maintains the upper solution in a stable state, suppressing spurious nucleation elsewhere in the upper chamber. The rate of permeation is controlled through a choice of porosity of the partition or by variation of the pressure difference maintained across the partition. Back diffusion of material from the second solution 12 into the first solution 11, if initially present, is reduced by choice of a partition of smaller pore size and use of a higher pressure difference to maintain the desired flow rate.

One material which has proven useful as a porous partition is a class of filter membranes composed of tetrafluoroethylene fibers. Exemplary apparatus has made use of rings of (fluorinated ethylene-propylene) 15 on either side of the membrane 13 to provide a fluid seal between ground surfaces of the upper 16 and lower 17 glass container. The apparatus is assembled, heated and pressed together to form the seal. Portions of the membrane surface can be masked by, for example, a halogenated wax to limit the portion of the surface over which crystal growth can take place.

As the first solution 11 is introduced into the second solution 12, the pressure difference may be maintained by slowly adding additional solution into the side arm 14 from an auxiliary container 18. In some chemical systems it is advantageous to slowly add material to solution 12 from an auxiliary container 19 in order to, for example, adjust the pH of the solution 12 as waste products are produced by the introduction of solution 11 into solution 12. A moderate amount of ambient temperature control (e.g., $\pm 3°$ C.) has proven useful.

EXAMPLES (1) Crystals of $K_2[Pt(CN)_4].Br_{0.3}.3H_2O$ were grown by the following method:

a 0.58 molar aqueous solution of $K_2[Pt(CN)_4]$ was placed in the upper chamber 16 of a glass growth apparatus (as shown in the Figure) and a 0.47 molar aqueous solution of $K_2[Pt(CN)_4]Br_2$ was placed in the lower chamber 17 with the liquid level in the side arm 14 being 7 centimeters above the liquid level in the upper chamber 16. The membrane 13 was composed of a mat of tetrafluoroethylene fibers. It had a mean pore size of approximately 2–5 micrometers. A water-tight seal between the membrane 13 and the glass was made by using two hexafluoropropylene rings 15 approximately 0.01 inches thick. The apparatus was assembled and heated to 325° C. while being held together. After 21 days at room temperature crystals as large as 3 cm in length with a 3 mm by 3 mm cross section were grown.

(2) A saturated solution of hydroquinone in n-propyl alcohol was prepared by constantly stirring an excess of hydroquinone in alcohol at room temperature. The mixture was then filtered to remove undissolved hydroquinone. A 5% excess of alcohol was added to the filtrate to insure total solution of the solid and the solution was transferred to the upper section of a crystal growing apparatus. The lower section of the apparatus was filled with concentrated hydrochloric acid (35%) to a 7 cm pressure head in the side arm. After approximately two days visible nucleus crystals of HCl $\beta$ quinol clathrate appeared on the upper surface of the teflon fiber membrane. They continued to grow as polyhedron prisms.

What is claimed is:

1. Method for the production of a crystalline body of a material comprising continually introducing first liquid from a reservoir of first liquid into a body of second liquid by slow permeation of first liquid through a porous partition separating the reservoir of first liquid from the body of second liquid, producing supersaturation of the material in the second liquid only in the vicinity of the partition and the crystalline body, and causing the first liquid to permeate through the partition by maintenance of a hydrostatic pressure differential across the partition, producing the crystalline body in contact with the partition, wherein the material is produced by a chemical reaction between at least one constituent of the first liquid and at least one constituent of the second liquid, wherein the material is $K_2[Pt(CN)_4].Br_{0.3}.3H_2O$, the first liquid is an aqueous solution of $K_2[Pt(CN)_4]$ and the second liquid is an aqueous solution of $K_2[Pt(CN)_4]Br_2$.

* * * * *